(12) United States Patent
Shimazawa et al.

(10) Patent No.: US 6,219,274 B1
(45) Date of Patent: Apr. 17, 2001

(54) FERROMAGNETIC TUNNEL MAGNETORESISTANCE EFFECT ELEMENT AND METHOD OF PRODUCING THE SAME

(75) Inventors: Koji Shimazawa; Satoru Araki; Haruyuki Morita, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/438,368

(22) Filed: Nov. 12, 1999

(30) Foreign Application Priority Data

Jun. 8, 1999 (JP) .................................................. 11-160531

(51) Int. Cl.[7] .................................................. G11C 11/00
(52) U.S. Cl. .............................. 365/158; 365/66; 365/97; 365/171; 365/188
(58) Field of Search ............................. 365/158, 69, 97, 365/171, 188

(56) References Cited

U.S. PATENT DOCUMENTS

| | | | |
|---|---|---|---|
| 5,764,567 | * 6/1998 | Parkin | 365/173 |
| 5,936,293 | * 8/1999 | Parkin | 257/422 |
| 5,949,622 | * 9/1999 | Kamiguchi et al. | 360/113 |
| 5,973,334 | * 10/1999 | Mizushima et al. | 257/25 |
| 5,986,858 | * 11/1999 | Sato et al. | 360/113 |
| 6,011,674 | * 1/2000 | Nakatani et al. | 360/113 |
| 6,021,065 | * 2/2000 | Daughton et al. | 365/158 |
| 6,069,820 | * 5/2000 | Inomata et al. | 365/171 |

FOREIGN PATENT DOCUMENTS

10093159 * 4/1998 (JP) .
11163436 * 6/1999 (JP) .

OTHER PUBLICATIONS

U.S. application No. 09/438,368, Nov. 12, 1999, pending.
U.S. application No. 09/538, 470, Mar. 30, 2000, pending.
U.S. application No. 09/542,907, Apr. 4, 2000, pending.
U.S. application No. 09/438,368, Nov. 12, 1999, pending.
U.S. application No. 09/621,088, Jul. 21, 2000, pending.
S.S.P. Parkin, "Spin Dependent Tunneling and its Application to Non–volatile Magnetic Random Access Memory," The 43RD Annual Conference on Magnetism & Magnetic Materials, Nov. 9–12, 1998, (Abstract only—GA–03).

* cited by examiner

Primary Examiner—Viet Q. Nguyen
(74) Attorney, Agent, or Firm—Oblon, Spivak, McClelland, Maier & Neustadt, P.C.

(57) ABSTRACT

The present invention relates to a ferromagnetic tunnel magnetoresistance effect element having a multilayered structure comprising a tunnel barrier layer and a first and a second ferromagnetic layer formed to sandwich the tunnel barrier layer therebetween, wherein the tunnel barrier layer is formed as an oxide film obtained by oxidizing a nonmagnetic metal layer according to a radical oxidation method. Thus, there can be obtained a ferromagnetic tunnel magnetoresistance effect element which is excellent in productivity and quality stability and highly excellent in TMR effect.

15 Claims, 4 Drawing Sheets

TWO FERROMAGNETIC LAYERS BEING PARALLEL IN MAGNETIZATION

TWO FERROMAGNETIC LAYERS BEING ANTIPARALLEL IN MAGNETIZATION

FERROMAGNETIC TUNNEL MAGNETORESISTANCE EFFECT ELEMENT AND METHOD OF PRODUCING THE SAME

BACKGROUND OF THE INVENTION

1. Field of the Invention

The present invention relates to a magnetoresistance effect film for reading the magnetic field intensity of a magnetic recording medium or the like as a signal and, in particular, to a ferromagnetic tunnel magnetoresistance effect element which is capable of reading a small magnetic field change as a greater electrical resistance change signal. The ferromagnetic tunnel magnetoresistance effect element is mainly incorporated in, for example, a hard disk drive so as to be used.

2. Description of the Prior Art

Following the high densification of hard disks, highly sensitive magnetic heads with high outputs have been demanded. In response to these demands, attention has been paid to a ferromagnetic tunnel magnetoresistance effect element having a multilayered structure in the form of ferromagnetic layer/tunnel barrier layer/ferromagnetic layer so as to utilize a ferromagnetic tunnel magnetoresistance effect.

The ferromagnetic tunnel magnetoresistance effect is a phenomenon that when a current is applied in a laminate direction between a pair of ferromagnetic layers which sandwich a tunnel barrier layer, a tunnel current flowing in the tunnel barrier layer changes depending on a relative angle of magnetization between both ferromagnetic layers.

In this case, the tunnel barrier layer is a thin insulation film which allows electrons to pass therethrough while keeping spin due to the tunnel magnetoresistance effect. When a relative angle of magnetization between both ferromagnetic layers is small, the tunnel probability is increased and, therefore, a resistance of the current flowing between both ferromagnetic layers is decreased. In contrast with this, when a relative angle of magnetization between both ferromagnetic layers is large, the tunnel probability is lowered so that a resistance of the current flowing therebetween is increased.

The ferromagnetic tunnel magnetoresistance effect element (hereinafter simply referred to as "TMR element") has been prepared in the following manner: A lower ferromagnetic layer is formed on a substrate. Then, after forming a non-magnetic layer of typically Al on the lower ferromagnetic layer, the non-magnetic layer (Al) is oxidized according to the natural oxidation method, the plasma oxidation method or the like so as to complete a tunnel barrier layer. Thereafter, an upper ferromagnetic layer is formed on the tunnel barrier layer.

When applying the TMR element to an HDD head, it is essential to lower the electrical resistance of the element. The reason is as follows: Specifically, the resistance of a TMR element is basically expressed by the following equation (1):

$$R\sigma = C\sigma \exp(-2\kappa d) \quad (1)$$

$$\kappa = (2m\phi/h^2)^{1/2}$$

wherein d represents a thickness of a barrier, $\phi$ represents a magnitude of a barrier potential measured from the Fermi level, and $C\sigma$ represents an amount determined by an electron state of magnetic layers and an insulation layer and may be considered approximately proportional to the product of the Fermi levels of the two magnetic layers.

According to the foregoing equation (1), it is understood that the lower resistance of the element can be achieved by reducing the thickness d of the barrier or reducing the barrier potential $\phi$. However, it is not preferable to reduce the barrier potential $\phi$ because the tunnel current itself is decreased to result in reduction of the TMR effect.

On the other hand, it has been reported that even in case of approximately the same barrier thicknesses d, a junction resistance largely changes due to a difference in forming method of a tunnel barrier layer (The 43rd MMM Conference 1998, GA-03). Specifically, it has been reported that when comparing tunnel barrier layers being oxides formed by the plasma oxidation method and the natural oxidation method, the tunnel barrier layer formed by the natural oxidation method has a resistance value smaller than that of the tunnel barrier layer formed by the plasma oxidation method by no less than two figures. Accordingly, it can be the that the natural oxidation method is a quite preferable oxidation method when considering an application to the HDD head. However, the natural oxidation method also has some problems. Specifically, the first problem is that no less than one oxidation hour is required for forming a barrier layer so that the productivity is low. The second problem is that after an oxide film is formed on the surface of a non-magnetic metal layer made of, for example, Al, subsequent oxidation does not progress readily due to a poor oxidation force so that the so-called "oxidation residue" is generated inside the non-magnetic metal layer. This "oxidation residue" works as impurities to extremely deteriorate the TMR effect.

The present invention has been made under these circumstances and has an object to provide a ferromagnetic tunnel magnetoresistance effect element which is excellent in productivity and quality stability and highly excellent in TMR effect, and a method of producing such a ferromagnetic tunnel magnetoresistance effect element.

SUMMARY OF THE INVENTION

For solving the foregoing problems, according to one aspect of the present invention, there is provided a ferromagnetic tunnel magnetoresistance effect element having a multilayered structure comprising a tunnel barrier layer and a first and a second ferromagnetic layer formed to sandwich the tunnel barrier layer therebetween, wherein the tunnel barrier layer is a non-magnetic oxide film formed by oxidizing a non-magnetic metal layer according to a radical oxidation method.

It is preferable that the non-magnetic oxide film is a film formed by contacting oxygen radical with the non-magnetic metal layer to be oxidized.

It is preferable that a pair of electrodes are electrically connected to the first and second ferromagnetic layers for causing a current to flow in a thickness direction of the multilayered structure.

It is preferable that one of the first and second ferromagnetic layers is set to change a direction of magnetization freely in response to an external magnetic field being magnetic information, and that a pinning layer is formed on a side of the other ferromagnetic layer for fixing a direction of magnetization thereof.

It is preferable that the first ferromagnetic layer is in the form of a combination of a pair of magnetic layers in antiferromagnetic type magnetic coupling and a non-magnetic metal layer sandwiched therebetween.

It is preferable that the second ferromagnetic layer is in the form of a combination of a pair of magnetic layers in antiferromagnetic type magnetic coupling and a non-magnetic metal layer sandwiched therebetween.

According to another aspect of the present invention, there is provided a method of producing a ferromagnetic tunnel magnetoresistance effect element having a multilayered structure including a tunnel barrier layer and a first and a second ferromagnetic layer formed to sandwich the tunnel barrier layer therebetween, the method comprising the steps of: forming one of the first and second ferromagnetic layers; and forming a non-magnetic metal layer on the one of the first and second ferromagnetic layers, then forming the tunnel barrier layer by oxidizing the non-magnetic metal layer according to a radical oxidation method.

It is preferable that the radical oxidation method is carried out by contacting oxygen radical with the non-magnetic metal layer to be oxidized.

It is preferable that the radical oxidation method is carried out by continuously contacting oxidized gas supplied from an oxygen radical source containing oxygen radical with the non-magnetic metal layer to be oxidized.

It is preferable that a distance between the non-magnetic metal layer to be oxidized and an oxygen radical source is set so that oxygen radical can maintain a radical state until reaching the non-magnetic metal layer.

It is preferable that the distance between the non-magnetic metal layer and the oxygen radical source is set to no greater than 300 mm.

It is preferable that a radical oxidation time is set to 1 to 30 minutes.

In the present invention, a large current can be allowed to flow by reducing the element resistance, so that a large output voltage can be obtained. Reducing the element resistance is desirable also from an aspect of preventing the electrostatic destruction (ESD).

DETAILED DESCRIPTION OF THE INVENTION

Hereinbelow, the preferred embodiment of the present invention will be described in detail with reference to the accompanying drawings.

Figure 1:
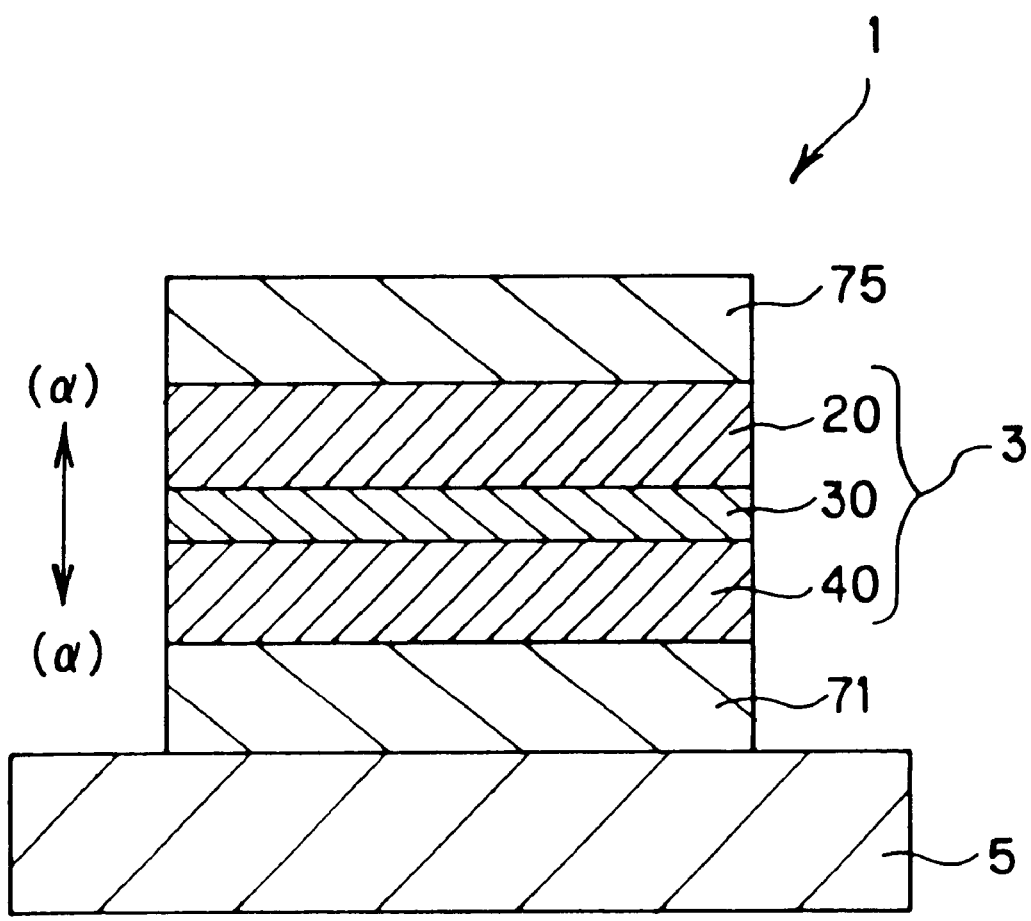
FIG. 1 is a sectional view showing a preferred example of a ferromagnetic tunnel magnetoresistance effect element according to the present invention.

FIG. 1 is a sectional view showing a preferred example of a ferromagnetic tunnel magnetoresistance effect element (hereinafter simply referred to as "TMR element") 1 according to the present invention. In this embodiment, the TMR element 1 is provided with a tunnel multilayered film 3 exhibiting a spin tunnel magnetoresistance effect. Specifically, the tunnel multilayered film 3 has a multilayered structure composed of, in a laminate fashion, a tunnel barrier layer 30 and first and second ferromagnetic layers 20 and 40 sandwiching the tunnel barrier layer 30 therebetween.

A pair of electrodes 75 and 71 are further stacked on the first and second ferromagnetic layers 20 and 40 on their sides remote from the tunnel barrier layer 30 for causing a current to flow in a thickness direction (($\alpha$) direction) of the tunnel multilayered film 3. Specifically, in the example shown in FIG. 1, the electrode 71, the second ferromagnetic layer 40, the tunnel barrier layer 30, the first ferromagnetic layer 20 and the electrode 75 are formed in turn on a substrate 5.

Of the two ferromagnetic layers 20 and 40, it is general that, for example, the first ferromagnetic layer 20 is set to function as a free layer which can freely change a direction of magnetization in response to an external magnetic field as magnetic information, while the second ferromagnetic layer 40 is set to function as a magnetization fixed layer whose magnetization direction is fixed in one direction. In such an arrangement, a pinning layer is formed for fixing the magnetization of the ferromagnetic layer 40. Naturally, the positions and functions of the ferromagnetic layers 20 and 40 may be reversed.

The ferromagnetic layers 20 and 40 are made preferably of a high spin polarization material for the purpose of obtaining a high TMR (change) ratio, such as Fe, Co, Ni, FeCo, NiFe, CoZrNb, FeCoNi. The thickness of the ferromagnetic layer 20 is 20 to 200 Å, preferably 40 to 100 Å. An excessive thickness of the ferromagnetic layer 20 tends to result in lowering of an output at the time of head operation and, in contrast, if it is thinner than required, magnetic properties become unstable to result in increase of noise at the time of head operation. The thickness of the ferromagnetic layer 40 is 10 to 50 Å, preferably 20 to 30 Å. If the thickness is more than required, the pinning of magnetization by a later-described antiferromagnetic body is weakened and, on the other hand, if it is less than required, the TMR ratio tends to reduce.

Each of the first and second ferromagnetic layers 20 and 40 is not limited to a single layer, and a laminate body in combination of a pair of magnetic layers in antiferromagnetic type magnetic coupling and a non-magnetic metal layer sandwiched therebetween is one of particularly preferable examples. As such a laminate body, a ferromagnetic layer in the form of a three-layered laminate body of CoFe (30 Å in thickness)/Ru (7 Å in thickness)/CoFe (20 Å in thickness) can be cited, for example.

The pinning layer is not shown in FIG. 1. However, for pinning the magnetization of the second ferromagnetic layer 40 in FIG. 1, a pinning layer in the form of an antiferromagnetic layer is normally formed between the electrode 71 and the second ferromagnetic layer 40. If the functions of the ferromagnetic layers 20 and 40 are reversed, a pinning layer in the form of an antiferromagnetic layer is formed between the electrode 75 and the first ferromagnetic layer 20.

Figure 4A:
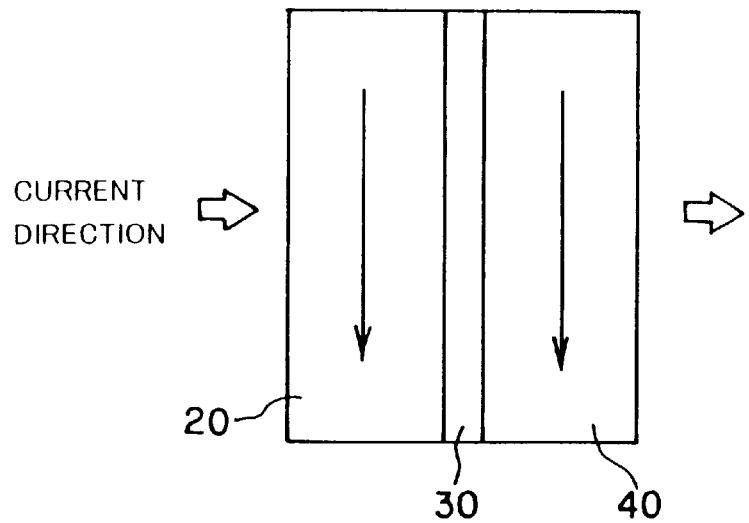
FIGS. 4A and 4B are diagrams for explaining a ferromagnetic tunnel magnetoresistance effect.
Figure 4B:
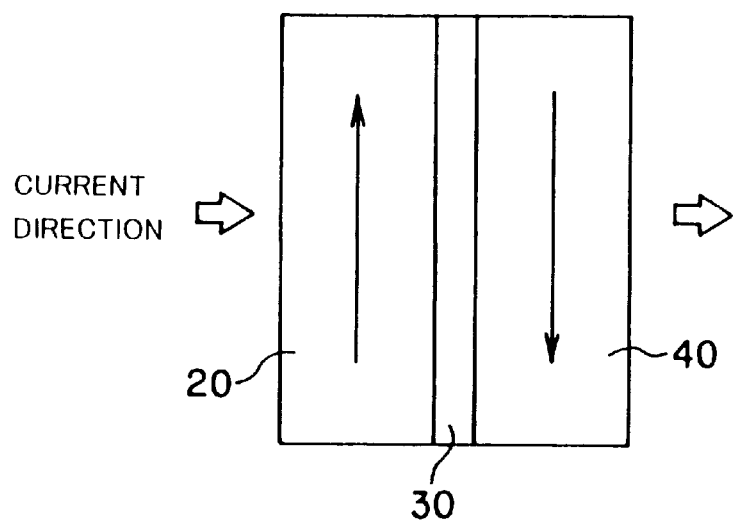

Now, the ferromagnetic tunnel magnetoresistance effect will be briefly explained with reference to FIGS. 4A and 4B. The ferromagnetic tunnel magnetoresistance effect is a phenomenon that when a current is applied in the laminate direction between the ferromagnetic layers 20 and 40 sandwiching the tunnel barrier layer 30, a tunnel current flowing in the tunnel barrier layer 30 changes depending on a relative angle of magnetization between the ferromagnetic layers 20 and 40. The tunnel barrier layer 30 is a thin insulation film which allows electrons to pass therethrough while keeping spin due to the tunnel magnetoresistance effect. As illustrated in FIG. 4A, when the ferromagnetic layers 20 and 40 are parallel in magnetization to each other (or a relative magnetization angle therebetween is small), the tunnel probability of electrons is increased and, therefore, the resistance of the current flowing between the ferromagnetic layers 20 and 40 is decreased. In contrast with this, as illustrated in FIG. 4B, when the ferromagnetic layers 20 and 40 are antiparallel in magnetization to each other (or a relative magnetization angle therebetween is large), the tunnel probability of electrons is lowered so that the resistance of the current flowing therebetween is increased. By utilizing the change in resistance depending on the change in relative magnetization angle, an external magnetic field is detected, for example.

The first feature of the present invention resides in that the tunnel barrier layer 30 is an oxide film formed through an oxidation treatment according to the radical oxidation method.

Figure 2A:
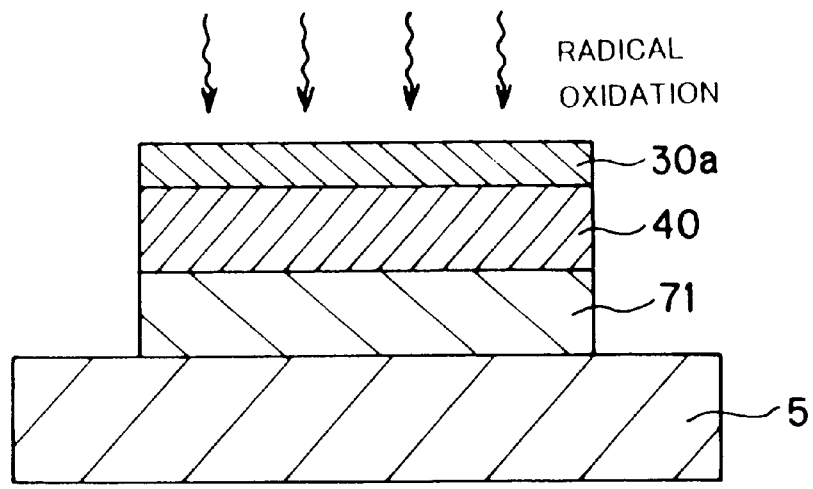
FIGS. 2A and 2B are sectional views showing, with a lapse of time, an example of a preferred producing method of the ferromagnetic tunnel magnetoresistance effect element according to the present invention.
Figure 2B:
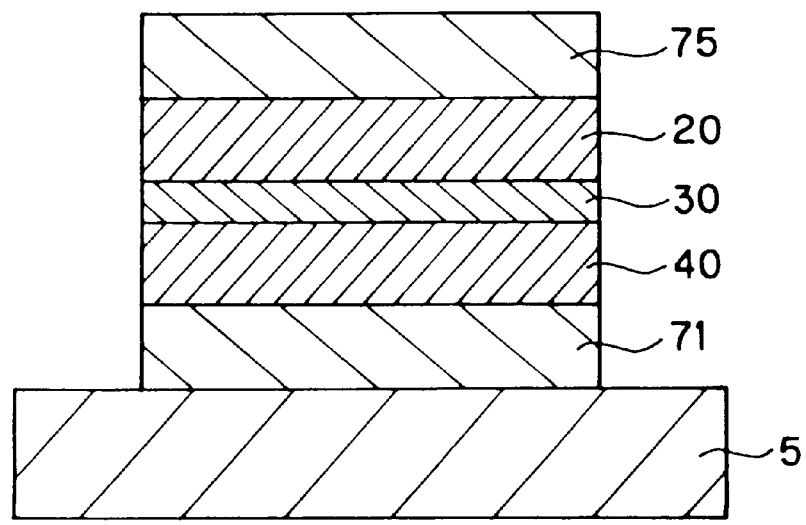

Specifically, as illustrated in FIG. 2A, a non-magnetic metal layer 30a made of Al, Ni, Gd, Mg, Ta, Ti, W, Mo or the like being a basic layer of a tunnel barrier layer is first formed on the second ferromagnetic layer 40, then oxygen radical is caused to contact with an upper film surface of the non-magnetic metal layer 30a so that the whole of the non-magnetic metal layer 30a is oxidized to form the tunnel barrier layer 30. A more specific preferred technique will be explained hereinbelow. The film formation of the ferromagnetic tunnel magnetoresistance effect element is carried out in a vacuum film forming apparatus. Upon forming the tunnel barrier layer, the non-magnetic metal layer 30a being the basic layer of the tunnel barrier layer is first formed and, by utilizing a pressure differential (the pressure differential between a pressure of an oxygen radical source and a pressure in a vessel of the vacuum film forming apparatus is called "driving force"), oxidized gas (substantially the same components as the oxygen radical source) is continuously fed into the vessel of the vacuum film forming apparatus from the oxygen radical source (including oxygen as a main component which partly includes radical oxygen in a radical state) so as to be continuously contacted with the non-magnetic metal layer 30a to be oxidized.

In this event, it is necessary to set a distance between the non-magnetic metal layer 30a and the oxygen radical source so that oxygen radical in the oxygen radical source can maintain the radical state until it reaches the non-magnetic metal layer 30a. As one standard for this, a distance Ts between the non-magnetic metal layer 30a and the oxygen radical source is set to preferably no greater than 300 mm, particularly 30 to 280 mm. If this value (distance) becomes to great (e.g. exceeding 300 mm), a sufficient oxide film can not be obtained even when a long time oxidation treatment over, for example, 60 minutes is carried out, so that a sufficient tunnel barrier characteristic or a large TMR ratio may not be obtained. On the other hand, if the distance between the non-magnetic metal layer 30a and the oxygen radical source becomes too short, there may be raised dispersion in degree of oxidation due to a rapid oxidation treatment, resulting in dispersion of the characteristic. For obtaining an excellent element characteristic, mild oxidation is desirable rather than rapid oxidation, and a radical oxidation time being an oxidation treatment time is set to preferably no longer than 30 minutes, particularly 1 to 30 minutes, and more preferably 1 to 25 minutes.

For preparing the oxygen radical source, for example, a radical gun is used to produce oxygen radical. As described above, in the present invention, the tunnel barrier layer 30 being an oxide layer is formed by using an oxidation force of oxygen radical. The radical gun is an apparatus for producing a radical state of molecules. The radical gun introduces microwaves at a frequency satisfying an electron cyclotron resonance (ECR) condition, into plasma trapped in a magnetic field so as to give energy to electrons in the plasma, thereby producing the radical state of molecules. Further, it is essential to take a measure so that the plasma used upon producing oxygen radical does not collide against a sample. For example, it is necessary to interpose a partition plate of quartz having passing holes between a plasma generating source and the substrate. As a method of producing oxygen radical, there is also a method using RF (radio-frequency) acceleration.

Now, radical will be briefly explained. In a stable ground state for many molecules, the quantum number of electrons relative to a magnitude of all spins is 0. On the other hand, for molecules of a certain kind, an electronic structure having unpaired electrons is a ground state. As opposed to a structure composed of paired electrons having spins directed in opposite directions, a spin pair is destroyed in unpaired electrons due to some condition. Thus, in the radical state, the quantum number of electrons relative to a magnitude of all spins is not 0. Such a molecule kind is called free radical and has a property with high reactivity.

The tunnel barrier layer 30 formed through the oxidation treatment using such oxygen radical is made of $Al_2O_3$, NiO, GdO, MgO, $Ta_2O_5$, $MoO_2$, $TiO_2$, $WO_2$ or the like. The thickness of the tunnel barrier layer 30 is desired to be as thin as possible for reducing the resistance of the element. However, if the thickness becomes too thin to cause pin holes, a leak current is generated, which is not preferable. In general, the thickness is set to about 5 to 20 Å.

In the present invention, the tunnel barrier layer 30 formed by using oxygen radical particularly has the following features:

(1) Oxidation of only the tunnel barrier layer 30 can be securely implemented, and the oxide film exhibits an excellent characteristic for the TMR effect. Specifically, the tunnel barrier layer 30 has a sufficient tunnel barrier property and, further, there is almost no adverse influence of oxidation onto the ferromagnetic layer located below the tunnel barrier layer 30 so that the large TMR ratio can be achieved.

(2) Since the oxidation force is properly mild, even if some dispersion occurs in oxidation time, substantially no influence is caused onto a film characteristic. Further, there is almost no so-called oxidation residue in the film. Accordingly, the high quality and the stability in quality can be ensured. Further, the productivity is considered to be fully satisfactory.

Figure 3:
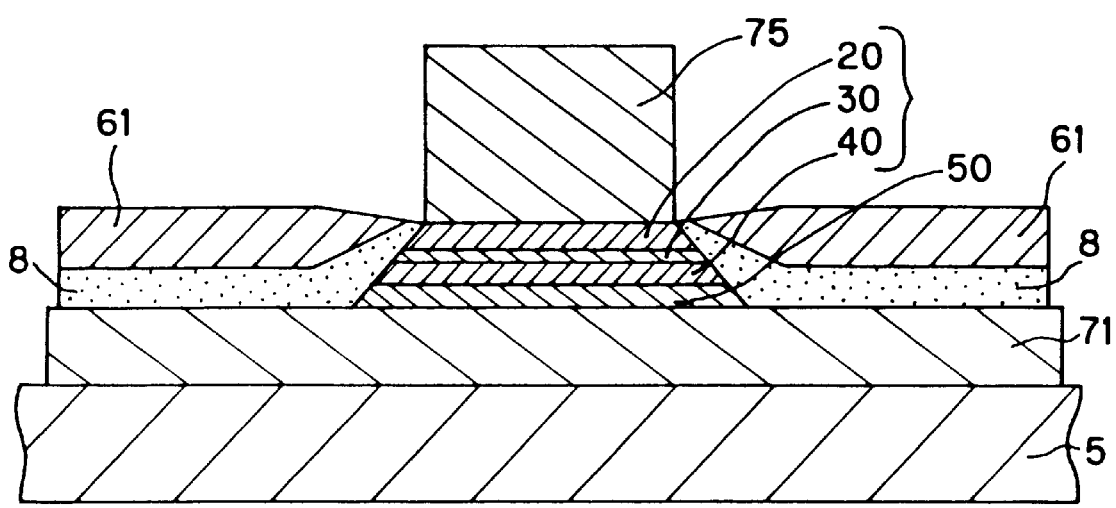
FIG. 3 is a sectional view showing an example wherein the ferromagnetic tunnel magnetoresistance effect element according to the present invention is applied to a tunnel magnetic head.

FIG. 3 shows an example wherein the ferromagnetic tunnel magnetoresistance effect element of the present invention is applied to a tunnel magnetic head. In FIG. 3, the tunnel magnetic head comprises the electrode 71, a pinning layer 50, the second ferromagnetic layer 40, the tunnel barrier layer 30, the first ferromagnetic layer 20 and the electrode 75 which are stacked on the substrate 5 in the order named. The tunnel magnetic head further comprises hard magnet layers 61, 61 for giving a bias magnetic field to the first ferromagnetic layer 20. The hard magnet layers 61, 61 are formed via insulation layers 8, 8 which ensure insulation of the electrodes 71 and 75. In this embodiment, the ferromagnetic tunnel magnetoresistance effect element is of a type wherein the pinning layer 50 is located at the bottom, but it may also be a type wherein the pinning layer 50 is located at the top. In the top type, the electrode 71, the first ferromagnetic layer 20, the tunnel barrier layer 30, the second ferromagnetic layer 40, the pinning layer 50 and the electrode 75 are stacked on the substrate 5 in the order named.

The invention of the foregoing ferromagnetic tunnel magnetoresistance effect element will be explained in further detail based on the following concrete experimental examples:

EXAMPLE I

Experiments were implemented with respect to the radical oxidation method (the present invention), the conventional plasma oxidation method (comparative examples I-B) and the conventional natural oxidation method (comparative examples I-C).

Inventive Experiments I-A Based on Radical Oxidation Method

Ferromagnetic tunnel magnetoresistance effect element samples shown below were prepared. Specifically, each sample was prepared by stacking an electrode layer 71 (Ta; 50 Å in thickness), a ferromagnetic layer 20 (laminate body of NiFe layer (100 Å in thickness) and CoFe layer (20 Å in thickness)) serving as a free layer, a tunnel barrier layer 30 (aluminum oxide; 10 Å in thickness), a pinned ferromagnetic layer 40 (CoFe; 30 Å in thickness) whose magnetization direction is fixed in a detection magnetic field direction, a pinning layer 50 (RuRhMn; 100 Å in thickness) for pinning magnetization of the ferromagnetic layer 40, and an electrode layer 75 (Ta; 50 Å in thickness), in the order named on a substrate (AlTiC with $Al_2O_3$) The. size of each sample was 2 µm×2 µm.

Each tunnel barrier layer 30 (aluminum oxide; 10 Å in thickness) was prepared by forming an Al film as a base of a barrier layer into a thickness of 10 Å, then forming it into an aluminum oxide (alumina) film using the radical oxidation method according to the present invention. The operational condition of the radical oxidation method was such that the power applied to plasma electrodes for producing radical in a radical generating source (radical gun) was set to 50 W, an atmosphere in a chamber for performing an oxygen radical treatment was set to $O_2$ pressure=2.5 Pa, and a distance Ts from the radical generating source for supplying oxygen radical to the tunnel barrier layer 30 disposed in the vacuum film forming apparatus was set to 100 mm. By changing an oxidation time as shown in Table 1, various samples (I-A-1 to I-A-12) were prepared.

With respect to each sample, (1) a resistance value R and (2) a TMR ratio were measured.

(1) Resistance Value R ($\Omega \cdot \mu m^2$)

A constant current was supplied so that a voltage applied to each sample became about 50 mV in a zero magnetic field, then a resistance value Rmin was derived from a minimum voltage value upon applying a magnetic field of ±900 (Oe) and set as a resistance value R ($\Omega \cdot \mu m^2$).

(2) TMR Ratio (%)

A constant current was supplied so that a voltage applied to each sample became about 50 mV in a zero magnetic field, then minimum and maximum resistance values Rmin and Rmax were derived from a minimum and a maximum voltage value, respectively, upon applying a magnetic field of ±900 (Oe), and a TMR ratio (%) was derived from the following equation (1):

$$TMR\ Ratio\ (\%) = (Rmax - Rmin)/Rmin \times 100 \quad (1)$$

The results are shown in Table 1.

TABLE 1

(Inventive Samples)

Radical Oxidation Method:
$O_2$ = 2.5 Pa atmosphere, Applied Power: 50 W, Ts = 100 mm

| Sample No. | Oxidation Time (min) | R ($\Omega \cdot \mu m^2$) | TMR (%) |
|---|---|---|---|
| I-A-1 | 1 | 24 | 3.2 |
| I-A-2 | 3 | 189 | 5.2 |
| I-A-3 | 5 | 552 | 6.4 |
| I-A-4 | 10 | 2367 | 10.8 |
| I-A-5 | 15 | 5546 | 13.0 |
| I-A-6 | 20 | 10147 | 12.5 |
| I-A-7 | 25 | 16212 | 11.4 |
| I-A-8 | 30 | 23775 | 10.4 |
| I-A-9 | 35 | 32863 | 9.5 |
| I-A-10 | 40 | 43499 | 7.2 |
| I-A-11 | 45 | 55706 | 6.4 |
| I-A-12 | 50 | 69502 | 6.4 |

Similar experiments were conducted wherein the foregoing ferromagnetic layer 40 (CoFe; 30 Å in thickness) was changed to a ferromagnetic layer in the form of a three-layered laminate body having a structure of CoFe (30 Å in thickness)/Ru (7 Å in thickness)/CoFe (20 Å in thickness). With this arrangement, the symmetry of output waveform upon head operation can be controlled and, therefore, it is more preferable from that aspect. However, since the results of the experiments, i.e. a relationship among the oxidation condition, the resistance value R and the TMR ratio, are similar to those of the experiments using the single ferromagnetic layer CoFe (30 Å in thickness), no resultant data are shown.

Comparative Experiments I-B (Comparative Examples I-B) Based on Conventional Plasma Oxidation Method Various samples of comparative examples I-B were prepared in the same manner as the inventive samples in the foregoing experiments I-A except that the tunnel barrier layer 30 (aluminum oxide; 10 Å in thickness) was changed. Specifically, an Al film as a base of a barrier layer was formed into a thickness of 10 Å, then formed into an aluminum oxide (alumina) film using the plasma oxidation method. The operational condition of the plasma oxidation method was such that $O_2$ pressure=0.5 Pa, RF (radio-frequency) output was set to 0.01 W/cm², and a distance Ts to a tunnel barrier layer disposed in the vacuum film forming apparatus was set to 100 mm. By changing an oxidation time as shown in Table 2, various comparative samples (I-B-1 to I-B-5) were prepared.

With respect to each comparative sample, (1) a resistance value R and (2) a TMR ratio were measured as in the foregoing inventive experiments.

The results are shown in Table 2.

TABLE 2

(Comparative Samples)

Plasma Oxidation Method: RF = 0.01 W/cm², Ts = 100 mm

| Sample No. | Oxidation Time (min) | R ($\Omega \cdot \mu m^2$) | TMR (%) |
|---|---|---|---|
| I-B-1 | 20 | 2210 | 10.32 |
| I-B-2 | 40 | 5560 | 12.74 |

TABLE 2-continued (Comparative Samples)

Plasma Oxidation Method: RF = 0.01 W/cm$^2$, Ts = 100 mm

| Sample No. | Oxidation Time (min) | R ($\Omega \cdot \mu m^2$) | TMR (%) |
|---|---|---|---|
| I-B-3 | 60 | 22070 | 3.08 |
| I-B-4 | 80 | 246800 | 1.26 |
| I-B-5 | 100 | 1689300 | 0.84 |

Comparative Experiments I-C (Comparative Examples I-C) Based on Conventional Natural Oxidation Method Various samples of comparative examples I-C were prepared in the same manner as the inventive samples in the foregoing experiments I-A except that the tunnel barrier layer 30 (aluminum oxide; 10 Å in thickness) was changed. Specifically, an Al film as a base of a barrier layer was formed into a thickness of 10 Å, then formed into an aluminum oxide (alumina) film using the natural oxidation method. The operational condition of the natural oxidation method was such that O$_2$ pressure=25000 Pa. By changing an oxidation time as shown in Table 3, various comparative samples (I-C-1 to I-C-10) were prepared.

With respect to each comparative sample, (1) a resistance value R and (2) a TMR ratio were measured as in the foregoing inventive experiments.

The results are shown in Table 3.

TABLE 3

(Comparative Samples)

Natural Oxidation Method: O$_2$ = 25000 Pa atmosphere

| Sample No. | Oxidation Time (min) | R ($\Omega \cdot \mu m^2$) | TMR (%) |
|---|---|---|---|
| I-C-1 | 10 | 37.9 | 2.27 |
| I-C-2 | 20 | 51.6 | 4.28 |
| I-C-3 | 30 | 59.0 | 6.12 |
| I-C-4 | 40 | 66.7 | 8.24 |
| I-C-5 | 50 | 72.9 | 9.35 |
| I-C-6 | 60 | 77.0 | 10.52 |
| I-C-7 | 70 | 79.7 | 10.53 |
| I-C-8 | 80 | 80.4 | 10.56 |
| I-C-9 | 90 | 82.8 | 10.61 |
| I-C-10 | 100 | 82.4 | 10.64 |

From the results shown in Table 1 to Table 3, it can be confirmed as follows:

From Table 1 showing the inventive samples, it is seen that the excellent tunnel barrier layer is formed with the oxidation time 10 to 30 minutes, wherein the high TMR ratio of no less than 10% (13% at maximum) can be obtained. Particularly with the oxidation time 15 to 20 minutes, the quite high TMR ratio of no less than 12% can be obtained. This means that an oxidation time band where the quite high TMR ratio of no less than 12% can be obtained is broad enough so that even if there is some dispersion in oxidation time, the quality of the resultant element is highly stable.

In contrast with this, as seen from Table 2, it is difficult to obtain the element of a low resistance value according to the plasma oxidation method, although the oxidation speed is high. Further, also from an aspect of providing the quality-stable element, the plasma oxidation method is not practical. Even if an oxidation time is slightly prolonged, the ferromagnetic layer located below the barrier layer is subjected to a damage of oxidation.

As seen from Table 3, according to the natural oxidation method, the oxidation speed is low so that an oxidation time of no less than 60 minutes is required for obtaining the element having the high TMR ratio of no less than 10%, resulting in poor productivity. Further, the TMR ratio can not exceed 10.7% (in Table 1 showing the inventive samples, a maximum of 13.0% is obtained), which may be due to a poor oxidation force causing oxidation residue.

EXAMPLE II

In the foregoing inventive experiments I-A using the radical oxidation method, the power applied to the plasma generating source for producing radical was changed from 50 W to 100 W. Further, the distance Ts from the radical generating source supplying oxygen radical to the tunnel barrier layer 30 disposed in the vacuum film forming apparatus was set to 30 mm (experiment II-1), 100 mm (experiment II-2), 200 mm (experiment II-3) and 300 mm (experiment II-4). By changing an oxidation time as shown in Table 4 to Table 7, various samples were prepared, wherein Ts=30 mm in Table 4, Ts=100 mm in Table 5, Ts=200 mm in Table 6 and Ts=300 mm in Table 7.

With respect to each of these samples, (1) a resistance value R and (2) a TMR ratio were measured as in the foregoing inventive experiments I-A.

The results are shown in Table 4 to Table 7.

TABLE 4

(Inventive Samples)

Radical Oxidation Method:
O$_2$ = 2.5 Pa atmosphere, Applied Power: 100 W, Ts = 30 mm

| Sample No. | Oxidation Time (min) | R ($\Omega \cdot \mu m^2$) | TMR (%) |
|---|---|---|---|
| II-1-1 | 1 | 34 | 6.2 |
| II-1-2 | 3 | 535 | 8.4 |
| II-1-3 | 5 | 1917 | 12.8 |
| II-1-4 | 10 | 10847 | 12.1 |
| II-1-5 | 15 | 28992 | 11.4 |
| II-1-6 | 20 | 62361 | 10.1 |
| II-1-7 | 25 | 117280 | 9.4 |
| II-1-8 | 30 | 159801 | 7.8 |
| II-1-9 | 35 | 245491 | 6.4 |
| II-1-10 | 40 | 351812 | 6.1 |
| II-1-11 | 45 | 465935 | 4.2 |
| II-1-12 | 50 | 606344 | 3.5 |

TABLE 5

(Inventive Samples)

Radical Oxidation Method:
O$_2$ = 2.5 Pa atmosphere, Applied Power: 100 W, Ts = 100 mm

| Sample No. | Oxidation Time (min) | R ($\Omega \cdot \mu m^2$) | TMR (%) |
|---|---|---|---|
| II-2-1 | 1 | 31 | 5.2 |
| II-2-2 | 3 | 246 | 6.4 |
| II-2-3 | 5 | 917 | 8.6 |
| II-2-4 | 10 | 3102 | 13.0 |
| II-2-5 | 15 | 7809 | 12.5 |
| II-2-6 | 20 | 14152 | 11.4 |
| II-2-7 | 25 | 22108 | 10.4 |
| II-2-8 | 30 | 31092 | 9.5 |
| II-2-9 | 35 | 45109 | 7.2 |
| II-2-10 | 40 | 57549 | 6.4 |
| II-2-11 | 45 | 78912 | 5.2 |
| II-2-12 | 50 | 90352 | 4.3 |

TABLE 6

(Inventive Samples)

Radical Oxidation Method:
$O_2$ = 2.5 Pa atmosphere, Applied Power: 100 W, Ts = 200 mm

| Sample No. | Oxidation Time (min) | R ($\Omega \cdot \mu m^2$) | TMR (%) |
|---|---|---|---|
| II-3-1  | 1  | 25    | 5.2  |
| II-3-2  | 3  | 144   | 3.2  |
| II-3-3  | 5  | 397   | 5.2  |
| II-3-4  | 10 | 987   | 6.4  |
| II-3-5  | 15 | 1991  | 10.5 |
| II-3-6  | 20 | 3014  | 13.9 |
| II-3-7  | 25 | 4381  | 12.5 |
| II-3-8  | 30 | 5821  | 11.4 |
| II-3-9  | 35 | 7328  | 10.4 |
| II-3-10 | 40 | 9053  | 9.5  |
| II-3-11 | 45 | 11048 | 7.2  |
| II-3-12 | 50 | 13291 | 6.5  |

TABLE 7

(Inventive Samples)

Radical Oxidation Method:
$O_2$ = 2.5 Pa atmosphere, Applied Power: 100 W, Ts = 300 mm

| Sample No. | Oxidation Time (min) | R ($\Omega \cdot \mu m^2$) | TMR (%) |
|---|---|---|---|
| II-4-1  | 1  | 28   | 2.3 |
| II-4-2  | 3  | 81   | 2.6 |
| II-4-3  | 5  | 161  | 2.7 |
| II-4-4  | 10 | 375  | 4.1 |
| II-4-5  | 15 | 719  | 6.0 |
| II-4-6  | 20 | 951  | 6.0 |
| II-4-7  | 25 | 1331 | 6.2 |
| II-4-8  | 30 | 1565 | 6.3 |
| II-4-9  | 35 | 1912 | 6.6 |
| II-4-10 | 40 | 2374 | 7.4 |
| II-4-11 | 45 | 2651 | 7.3 |
| II-4-12 | 50 | 3121 | 7.2 |

From the results shown in Table 4 to Table 7, it is seen that the optimum oxidation time changes depending on the distance Ts between the radical source and the thin film to be oxidized. In the subject apparatus structure, even if the applied power is increased to more than 100 W, it is considered that Ts=300 mm or the like may be the limit.

Further, in consideration of the stability of the element quality, it is considered that Ts=30 mm or the like is adequate as a minimum value of Ts.

EXAMPLE III

In the foregoing inventive experiments I-A using the radical oxidation method, the power applied to the plasma generating source for producing radical was changed from 50 W to 150 W. As the applied power is increased, the density of radical is also increased correspondingly. No other changes were made as compared with the inventive experiments I-A. By changing an oxidation time as shown in Table 8, various samples were prepared.

With respect to each sample, (1) a resistance value R and (2) a TMR ratio were measured as in the foregoing inventive experiments I-A.

The results are shown in Table 8.

TABLE 8

(Inventive Samples)

Radical Oxidation Method:
$O_2$ = 2.5 Pa atmosphere, Applied Power: 150 W, Ts = 100 mm

| Sample No. | Oxidation Time (min) | R ($\Omega \cdot \mu m^2$) | TMR (%) |
|---|---|---|---|
| III-1  | 1  | 38     | 6.4  |
| III-2  | 3  | 544    | 8.6  |
| III-3  | 5  | 2155   | 13.4 |
| III-4  | 10 | 12861  | 12.1 |
| III-5  | 15 | 32781  | 11.8 |
| III-6  | 20 | 73551  | 10.6 |
| III-7  | 25 | 140231 | 9.5  |
| III-8  | 30 | 228641 | 7.5  |
| III-9  | 35 | 323684 | 6.8  |
| III-10 | 40 | 458037 | 6.4  |
| III-11 | 45 | 655194 | 5.2  |
| III-12 | 50 | 828165 | 4.6  |

Among Table 1, Table 5 and Table 8, the condition only differs in magnitude of the applied power. From the results shown in Table 1, Table 5 and Table 8, it is seen that the optimum oxidation time changes depending on the magnitude of the applied power. If the applied power is increased, the density of radical is increased so that the oxidation time can be shortened. However, through comparison of the maximum values of the TMR ratio, it is seen that there is an optimum range of the radical density. The abrupt oxidation process is not preferable, and a preferred range of the applied power is 50 to 100 W.

As appreciated from the foregoing results, the effect of the present invention is clear. Specifically, the present invention is arranged such that, in the ferromagnetic tunnel magnetoresistance effect element having the multilayered structure composed of the tunnel barrier layer and the first and second ferromagnetic layers formed to sandwich the tunnel barrier layer therebetween, the tunnel barrier layer is formed as an oxide film obtained by oxidizing the non-magnetic metal layer according to the radical oxidation method. Thus, there can be obtained the ferromagnetic tunnel magnetoresistance effect element which is excellent in productivity and quality stability and highly excellent in TMR effect.

What is claimed is:

1. A ferromagnetic tunnel magnetoresistance effect element having a multilayered structure, comprising:

a first ferromagnetic layer;

a second ferromagnetic layer; and a tunnel barrier layer;

wherein said tunnel barrier layer is sandwiched between said first ferromagnetic layer and said second ferromagnetic layer; and wherein said tunnel barrier layer is a non-magnetic oxide film formed by oxidizing a non-magnetic metal layer according to a radical oxidation method.

2. The ferromagnetic tunnel magnetoresistance effect element according to claim 1, wherein said non-magnetic oxide film is formed by contacting an oxygen radical with said non-magnetic metal layer.

3. The ferromagnetic tunnel magnetoresistance effect element according to claim 1, wherein a pair of electrodes is electrically connected to said first ferromagnetic layer and said second ferromagnetic layer; and wherein a current flows between said electrodes in a direction of a thickness of said multilayered structure.

4. The ferromagnetic tunnel magnetoresistance effect element according to claim 1, wherein in one of said first ferromagnetic layer and said second ferromagnetic layer a direction of magnetization changes freely in response to an external magnetic field, and wherein a pinning layer is formed on a side of the other ferromagnetic layer for fixing a direction of magnetization of said other ferromagnetic layer.

5. The ferromagnetic tunnel magnetoresistance effect element according to claim 1, wherein said first ferromagnetic layer is in the form of a combination of a pair of magnetic layers in antiferromagnetic type magnetic coupling and a non-magnetic metal layer sandwiched therebetween.

6. The ferromagnetic tunnel magnetoresistance effect element according to claim 1, wherein said second ferromagnetic layer is in the form of a combination of a pair of magnetic layers in antiferromagnetic type magnetic coupling and a non-magnetic metal layer sandwiched therebetween.

7. A method for producing a ferromagnetic tunnel magnetoresistance effect element having a multilayered structure comprising a first ferromagnetic layer; a second ferromagnetic layer; and a tunnel barrier layer; wherein said tunnel barrier layer is sandwiched between said first ferromagnetic layer and said second ferromagnetic layer; said method comprising the steps of:

forming one of said first ferromagnetic layer and said second ferromagnetic layer; and forming a non-magnetic metal layer on one of said first ferromagnetic layer and said second ferromagnetic layer;

forming said tunnel barrier layer by oxidizing said non-magnetic metal layer according to a radical oxidation method.

8. The method according to claim 7, wherein said radical oxidation method is carried out by contacting an oxygen radical with said non-magnetic metal layer.

9. The method according to claim 8, wherein said radical oxidation method is carried out by continuously contacting an oxidized gas supplied from an oxygen radical source containing an oxygen radical with said non-magnetic metal layer.

10. The method according to claim 9, wherein a distance between said non-magnetic metal layer and said oxygen radical source is set so that said oxygen radical maintains a radical state until reaching said non-magnetic metal layer.

11. The method according to claim 10, wherein the distance between said non-magnetic metal layer and said oxygen radical source is not greater than 300 mm.

12. The method according to claim 7, wherein a time of said radical oxidation is 1 to 30 minutes.

13. The method according to claim 7, wherein said forming is carried out in a vacuum film forming apparatus.

14. The method according to claim 9, wherein said oxygen radical source is a radical gun.

15. The method according to claim 14, wherein said radical gun introduces microwaves at an electron cyclotron resonance frequency into a plasma trapped in a magnetic field, thereby producing radicals.

* * * * *